United States Patent
Park et al.

[11] Patent Number: 6,037,237
[45] Date of Patent: Mar. 14, 2000

[54] TRENCH ISOLATION METHODS UTILIZING COMPOSITE OXIDE FILMS

[75] Inventors: Moon-han Park, Kyungki-do; Sug-hun Hong; Yu-gyun Shin, both of Seoul, all of Rep. of Korea

[73] Assignee: Samsung Electronics Co., Ltd., Rep. of Korea

[21] Appl. No.: 09/022,513

[22] Filed: Feb. 12, 1998

[30] Foreign Application Priority Data

Jul. 25, 1997 [KR] Rep. of Korea ............ 97-35212

[51] Int. Cl.[7] .................................. H01L 21/762
[52] U.S. Cl. ..................... 438/424; 438/435; 438/692
[58] Field of Search ............................. 438/435, 437, 438/424, FOR 227, 692

[56] References Cited

U.S. PATENT DOCUMENTS

| | | |
|---|---|---|
| 4,729,006 | 3/1988 | Dally et al. . |
| 4,960,727 | 10/1990 | Mattox et al. . |
| 5,168,343 | 12/1992 | Sakamoto . |
| 5,387,538 | 2/1995 | Moslehi . |
| 5,447,884 | 9/1995 | Fahey et al. . |
| 5,726,090 | 3/1998 | Jang et al. . |
| 5,741,740 | 4/1998 | Jang et al. . |
| 5,837,612 | 11/1998 | Ajuria et al. . |

FOREIGN PATENT DOCUMENTS

| | | |
|---|---|---|
| 0 396 369 A2 | 11/1990 | European Pat. Off. . |
| 2 256 967 | 12/1992 | United Kingdom . |

OTHER PUBLICATIONS

Park et al., "Stress Minimization in Deep Sub–Micron Full CMOS Devices by Using an Optimized Combination of the Trench Filling CVD Oxides," 1997 IEEE, IEDM 97–669–672, 27.4.1–27.4.4.

Shiozawa et al., "Electrical Characteristics of Ultra–Fine Trench Isolation Fabricated by a New Two–Step Filling Process," Jpn. J. Appl. Phys., vol. 35 (1996), pp. L1625–L1627, Part 2, No. 12B, Dec. 15, 1996.

*Primary Examiner*—George Fourson
*Attorney, Agent, or Firm*—Myers Bigel Sibley & Sajovec

[57] ABSTRACT

A multilayer oxide film, including at least two oxide layers having differing stress characteristics, is used in a trench isolation method. Preferably, at least a first one of the oxide layers has tensile stress characteristics and at least a second one of the oxide layers has compressive stress characteristics. Thus, during densification, the overall stress can be reduced. The multilayer film is preferably formed by sequentially stacking first and second oxide films which have opposite stress characteristics. In one example, the first oxide film is a tetra-ethyl-orthosilicate (TEOS)-$O_3$ based chemical vapor deposition (CVD) oxide film and the second oxide film is selected from the group consisting of TEOS-based plasma-enhanced CVD (PECVD) oxide film, an $SiH_4$ based PECVD oxide film and a high density plasma (HDP) oxide film. In another embodiment, the first oxide film is an HDP oxide film and the second film is a TEOS-$O_3$ based CVD oxide film. Accordingly, integrated circuits with reduced stress may be fabricated, thereby allowing increased performance of the integrated circuits.

15 Claims, 4 Drawing Sheets

TRENCH ISOLATION METHODS UTILIZING COMPOSITE OXIDE FILMS

FIELD OF THE INVENTION

The present invention relates to methods for manufacturing integrated circuit devices, and more particularly, to a trench isolation methods for integrated circuits.

BACKGROUND OF THE INVENTION

Integrated circuits include many active devices in an integrated circuit substrate such as a semiconductor substrate. These active devices are generally isolated from one another. Accordingly, isolation structures and methods are widely used in integrated circuits. One important isolation structure and method is a trench isolation structure and method.

Conventional trench isolation structures are fabricated by forming a trench in an integrated circuit substrate and forming an isolation region of insulating material in the trench. Trench isolation structures and methods are described in U.S. Pat. No. 5,387,538 to Moslehi entitled "Method of Fabrication of Integrated Circuit Isolation Structure" and U.S. Pat. No. 5,447,884 to Fahey et al. entitled "Shallow Trench Isolation With Thin Nitride Liner".

In a conventional trench isolation method, a predetermined region of an integrated circuit substrate such as a semiconductor substrate is etched to form a trench region, generally having a quadrilateral section, and an isolation film made of insulating material is formed in the trench region. Then, a process is performed to oxidize the trench sidewalls or to densify an insulating material filled in the trench region. This process is performed to cure damage generated during etching to form the trench.

Unfortunately, in this process, stress may be generated due to a difference in thermal expansion coefficient between the isolation film and the substrate. The stress may be concentrated in the semiconductor substrate around the isolation film, and especially at the corners of the trench. The accumulated stress in the substrate causes crystal defects such as dislocation in the substrate. Such defects may cause an increase in junction leakage currents of the integrated circuit devices. The increased leakage currents may adversely impact performance and/or reliability of the devices.

SUMMARY OF THE INVENTION

It is therefore an object of the present invention to provide improved trench isolation methods for integrated circuits.

It is another object of the present invention to provide trench isolation methods that can reduce stresses.

These and other objects are provided, according to the present invention, by using a multilayer oxide film, including at least two oxide layers having differing stress characteristics in a trench isolation method. Preferably, at least a first one of the oxide layers has tensile stress characteristics and at least a second one of the oxide layers has compressive stress characteristics. Thus, during densification, the overall stress can be reduced.

More specifically, trench isolation methods for integrated circuit devices according to the present invention form a trench filling oxide film on an integrated circuit substrate having a plurality of trenches therein. The trench filling oxide film comprises a composite film of two stacked layers having different stress characteristics. The trench filling oxide film is then densified and planarized to form a trench filling layer in the trench regions.

The multilayer film is preferably formed by sequentially stacking first and second oxide films which have opposite stress characteristics. More specifically, one of the first and second oxide film has tensile stress characteristics and the other of the first and second oxide films has compressive stress characteristics. In one example, the first oxide film is a tetra-ethyl-orthosilicate (TEOS)-$O_3$ based chemical vapor deposition (CVD) oxide film and the second oxide film is selected from the group consisting of TEOS-based plasma-enhanced CVD (PECVD) oxide film, an $SiH_4$ based PECVD oxide film and a high density plasma (HDP) oxide film. In another embodiment, the first oxide film is an HDP oxide film and the second film is a TEOS-$O_3$ based CVD oxide film.

Prior to forming the trench filling oxide film, a mask layer may be formed on the integrated circuit substrate to expose predetermined regions thereof and the exposed regions of the substrate may be etched using the mask layer as an etch mask to form the trenches. An oxide film may also be formed on the sidewall and the bottom surfaces of the trenches. The mask layer may include a pad oxide film and a silicon nitride film on the pad oxide film. Alternatively, a sacrificial oxide film may also be included on the nitride film.

The densification step may be performed by thermally treating at between about 1000° C. and 1200° C. The planarization may take place by chemical mechanical polishing (CMP) or by etching. The mask layer may be removed after planarization. Accordingly, integrated circuits with reduced stress may be fabricated, thereby allowing increased performance of the integrated circuits.

DETAILED DESCRIPTION OF PREFERRED EMBODIMENTS

Figure 1:
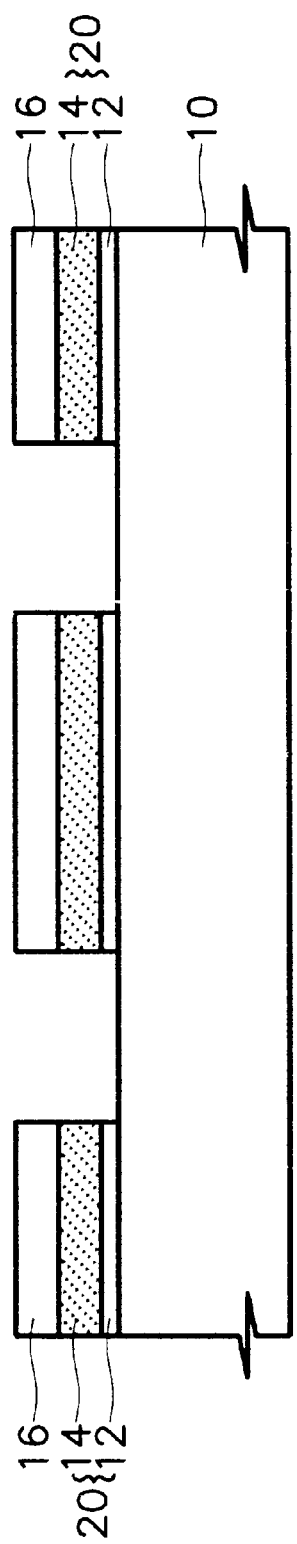
FIGS. 1 through 5 are cross-sectional views illustrating trench isolation methods according to preferred embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Referring to FIG. 1, the step of forming a mask layer 20 and a sacrificial layer 16 on an integrated circuit substrate such as a semiconductor substrate 10 will now be described. First, a pad oxide film of a thickness of 300 Å or less, a nitride film of a thickness of 2000 Å or less, and a sacrificial oxide film of a thickness of 3000 Å or less are sequentially formed on the semiconductor substrate 10. The sacrificial oxide film is sacrificed to protect the nitride film during the formation of a trench region in a subsequent process, and is formed by a thermal oxidation method. The sacrificial oxide film can be omitted depending on the circumstances.

Next, the sacrificial oxide film, the nitride film and the pad oxide film are sequentially patterned, to thereby form the sacrificial layer 16, and the mask layer 20 comprised of a pad oxide film pattern 12 and a nitride film pattern 14. The three layers expose a predetermined region of the semiconductor substrate 10.

Figure 2:
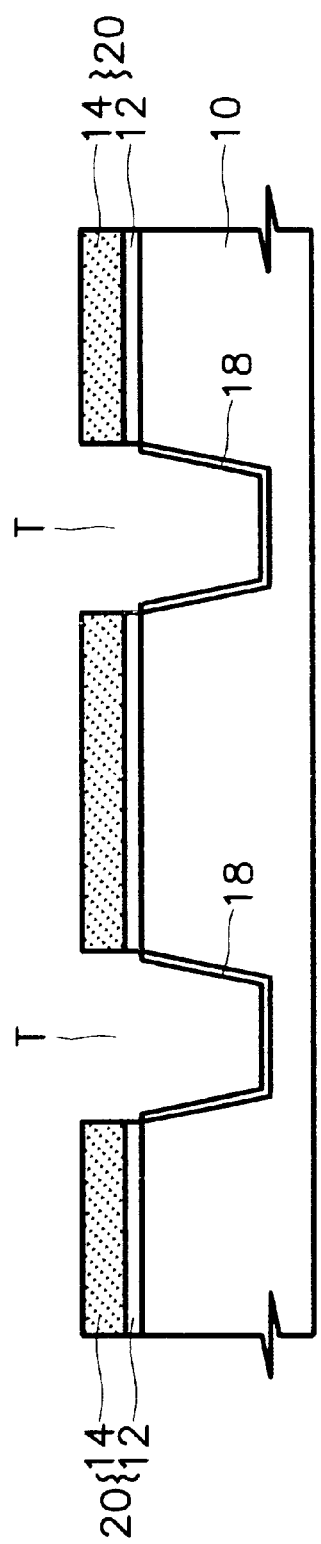

The step of forming a trench region (T) is represented in FIG. 2. Referring to FIG. 2, the exposed portion of the semiconductor substrate 10 is selectively dry-etched using the mask layer 20 as an etch mask, to thus form the trench region (T) having a depth of about 1000 Å or less. The sacrificial layer 16 is also etched and almost completely removed simultaneously with the formation of the trench region (T). Only a very thin oxide film (not shown) may remain on the surface of the mask layer 20. Thereafter, in order to cure damage generated during the etching to form the trench region (T), an oxide film 18 is formed on the sidewalls and bottom surfaces of the trench region (T) using a thermal oxidation method.

Figure 3:
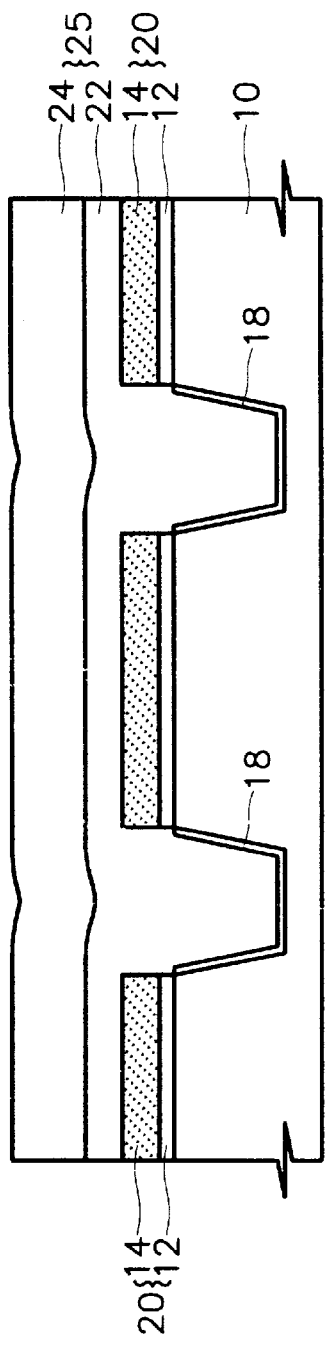

FIG. 3 shows the step of forming a trench filling oxide film 25. The trench filling oxide film 25 is formed of a composite film comprised of two oxide films each having a different stress characteristics after deposition. For example, in order to form the trench filling oxide film 25, a first oxide film 22 with a large tensile stress, having excellent trench filling characteristics, is formed to a predetermined thickness in the trench region (T) and on the upper surface of the nitride film pattern 14. Then, a second oxide film 24 with a larger compressive stress than the first oxide film 22 is formed to a predetermined thickness on the first oxide film 22.

The sum of the thicknesses of the first and second oxide films 22 and 24 preferably corresponds to the sum of the depth of the trench region (T), the thicknesses of the pad oxide film pattern 12 and nitride film pattern 14, and a thickness to be removed by etching in a subsequent planarization process. For instance, when the depth of the trench region (T) is 6000 Å and the combined thickness of the pad oxide film 12 and the nitride film pattern 14 is 2000 Å, the sum of the thicknesses of the first and second oxide films 22 and 24 may be set to about 1000 Å to allow about 2000 Å to be removed in the subsequent planarization process.

The first oxide film 22 may be formed, for example, of TEOS (tetra-ethyl-orthosilicate)-$O_3$ by a chemical vapor deposition (CVD) method. This is hereinafter called "a TEOS-$O_3$ based CVD oxide film". The second oxide film 24 may be formed, for example, of TEOS by a plasma enhanced CVD (PECVD) method, (hereinafter, called "a TEOS-$O_3$ based PECVD oxide film"), of $SiH_4$ by the PECVD method (hereinafter, called as "$SiH_4$ based PECVD oxide film"), or of a high density plasma (HDP) oxide film. Alternately, the first oxide film 22 can be an HDP oxide film. In this case, the second oxide film 24 may be the TEOS-$O_3$ CVD based oxide film.

The trench filling oxide film 25 is formed of a composite film comprised of two layers as described above for at least the following reason: When a trench filling layer is formed by depositing only a CVD oxide film based on a filling material (e.g., TEOS-$O_3$) for filling the trench region by a conventional method, the trench filling layer has tendency to become porous after being deposited. Accordingly, if a wet etching process is carried out using an etchant such as a HF solution with respect to the trench filling layer, an excessive portion of the trench filling layer may be etched. As a result, it may be difficult to obtain a trench isolation film having a desired profile. Therefore, a technique of densifying the trench filling layer by performing a thermal treatment at a temperature of 1000° C. or more is often used after forming the trench filling layer.

However, it has not been generally recognized that an initial stress is generated right after the trench filling layer is formed, and a thermal stress is generated during the above thermal treatment at high temperature. An experiment was performed to measure stress in the trench filling layer, when only a conventional single oxide film TEOS-$O_3$ based CVD is used as a filling material for filling the trench region. In this experiment, the oxide film was found to have a high tensile stress of the order of $10^9$ dyne/cm$^2$, immediately after being deposited. Also, when the temperature reaches about 700° C. during a thermal treatment for densifying the oxide film, the high tensile stress becomes of the order of $10^{10}$ dyne/cm$^2$, so that the oxide film applies stress to the silicon substrate.

Consequently, if the trench filling layer is formed of an oxide film having stress characteristics of only one type, e.g., a single film comprised of only TEOS-$O_3$ based CVD oxide film exhibiting tensile stress, the initial stress right after being deposited and the stress generated during the thermal treatment for densification may increase. Thus, the probability of defects in the semiconductor device can become higher. Specific experimental data on the above result will be described below.

According to the present invention, in order to allow reduction of the initial stress of the trench filling material layer and the excess stress generated during the thermal treatment, the trench filling oxide film 25 is formed of a composite film comprised of two oxide films having an opposite stress characteristics after being deposited. For example, the two oxide films may be a first oxide film 22 with a tensile stress and a second oxide film 24 with a compressive stress. The trench filling oxide film may also be formed of a composite film comprised of a first oxide film with a compressive stress and a second oxide film with a tensile stress. Thereafter, the trench filling oxide film 25 is thermally treated at a temperature of about 1000 to 1200° C., to be densified.

Figure 4:
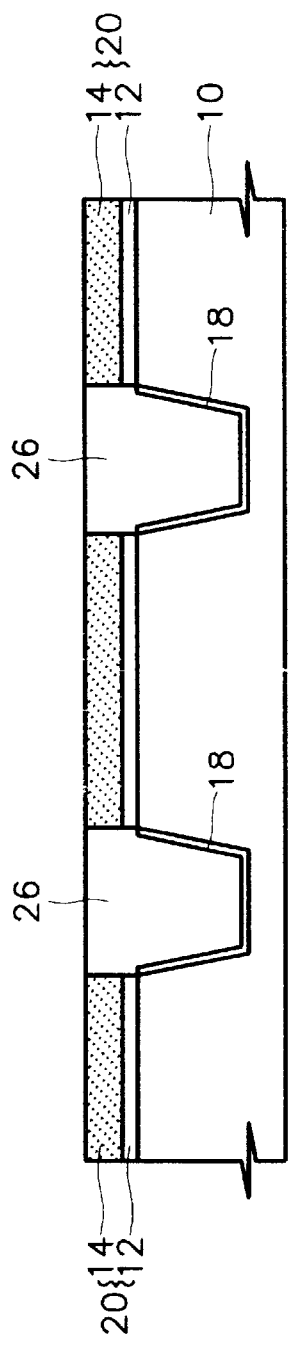

FIG. 4 is a sectional view explaining the step of planarizing the trench filling oxide film. The trench filling oxide film 25 is planarized by a chemical mechanical polishing (CMP) method until the nitride film pattern 14 used as an etch prevention layer is exposed, thereby forming a trench filling layer 26 in the trench region (T).

Figure 5:
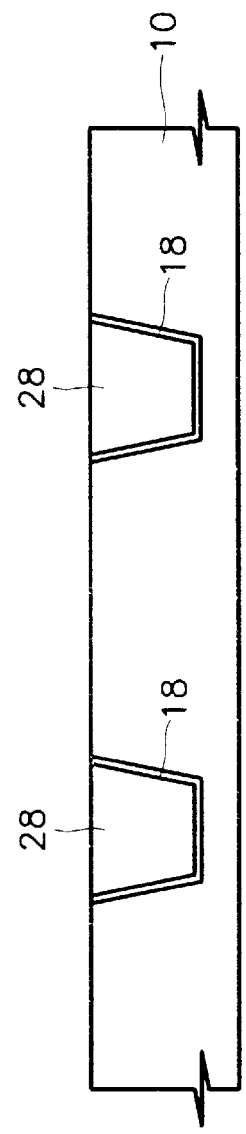

FIG. 5 shows the step of forming an isolation film. To be more specific, the exposed nitride film pattern 14 is removed by a nitride film etchant. Next, the pad oxide film pattern 12 is removed by an oxide film etchant, to thereby expose the surface of the semiconductor substrate 10, and define an active region. As a result, the isolation film 28 is formed having a height approximately same as the surface height of the active region.

According to the preferred embodiment of the present invention as described above, a trench filling oxide film is formed of a composite film comprised of two oxide films having opposite stress characteristics. Thus, during the initial deposition and the subsequent thermal treatment of the trench filling oxide film, stress in the trench filling oxide film and stress applied by the trench filling oxide film to the semiconductor substrate are reduced. Consequently, the generation of silicon defects due to the stress in the semiconductor substrate can be suppressed.

Table 1 illustrates the results of an experiment for evaluating the effects of trench isolation methods according to the present invention. In this experiment, the first and second oxide films comprising the trench filling oxide film are deposited to various thicknesses to form the trench filling oxide film having a total thickness of 1000 Å. Then, initial stress in the trench filling oxide film was immediately measured. The first oxide film was formed of the TEOS-$O_3$ based CVD oxide film with a compressive stress. The second oxide film was formed of the TEOS based PECVD oxide film with a tensile stress.

TABLE 1

| sample | thickness of first oxide film (nm) | thickness of second oxide film (nm) | initial stress in trench filling oxide film (dyne/cm$^2$) |
| --- | --- | --- | --- |
| P0  | 1000 | 0    | $4.0 \times 10^9$ |
| P1  | 900  | 100  | $2.9 \times 10^9$ |
| P4  | 600  | 400  | $1.5 \times 10^9$ |
| P7  | 300  | 700  | $1.7 \times 10^8$ |
| P10 | 0    | 1000 | $-8.6 \times 10^8$ |

As shown in Table 1, the initial stress decreases as the second oxide film becomes thicker than the first oxide film.

Figure 6:
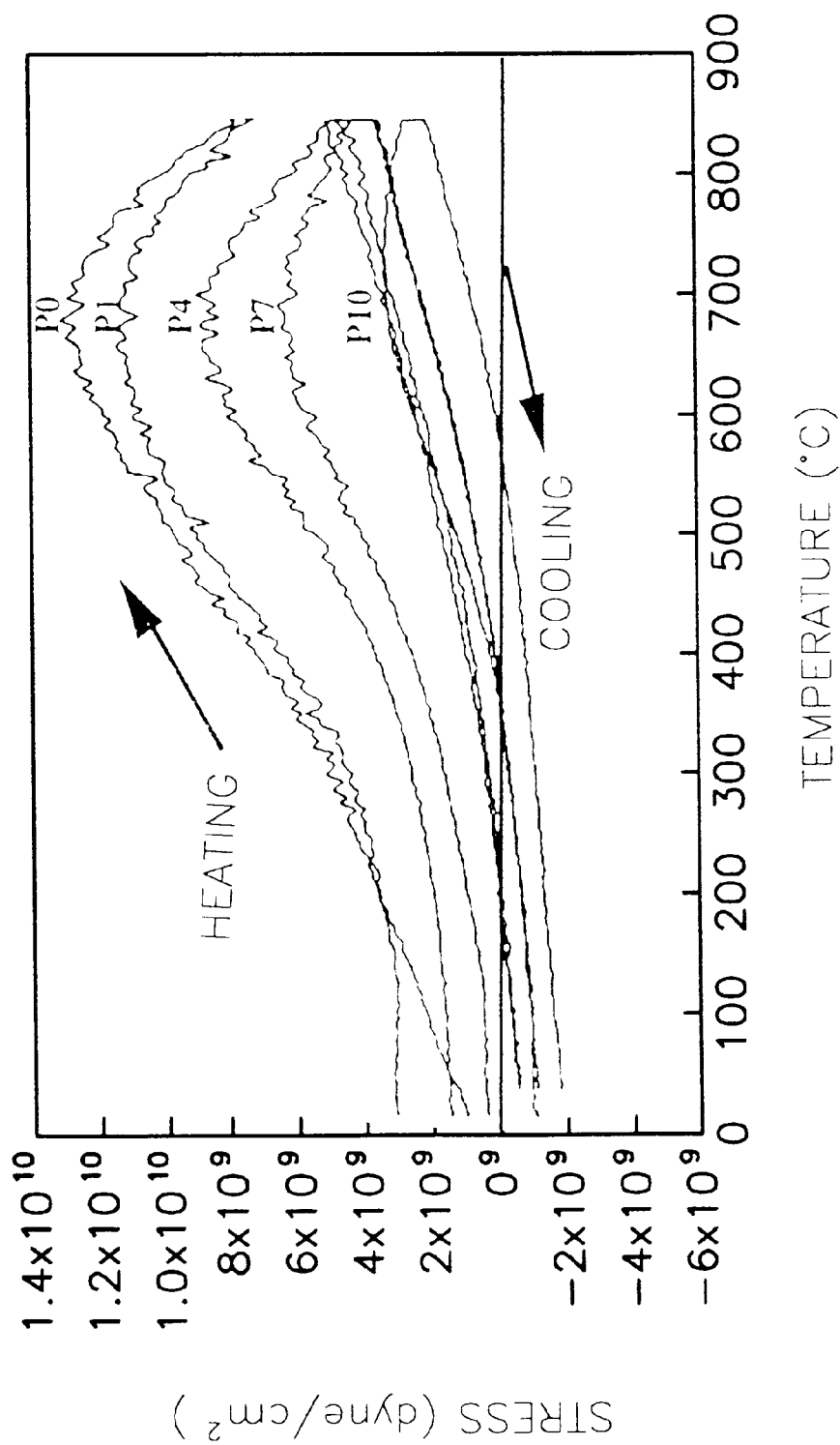
FIG. 6 is a graph showing stress hysteresis depending on the variation of temperature when a thermal treatment is performed for densifying a trench filling oxide film.

FIG. 6 is a graph showing stress hysteresis generated depending on a change in temperature when performing a thermal treatment for densification of the trench filling oxide film of each sample of Table 1. The data of FIG. 6 was measured beginning about thirty minutes after the measurement of the results of Table 1. It can be seen that the initial stress, i.e., stress at a normal temperature, is different from the result of Table 1 in the case of P0. The apparent reason is that when the trench filling oxide film is formed only of the TEOS-$O_3$ based CVD oxide film, moisture in the air apparently begins to be absorbed into the oxide film right after the oxide film is formed. This apparently influenced the results of FIG. 6.

FIG. 6 shows that the peak stress generated during the thermal treatment appears as follows: P0>P1>P4>P7>P10. That is, a smaller stress is generated during the thermal treatment as the second oxide film becomes thicker than the first oxide film.

Figure 7:
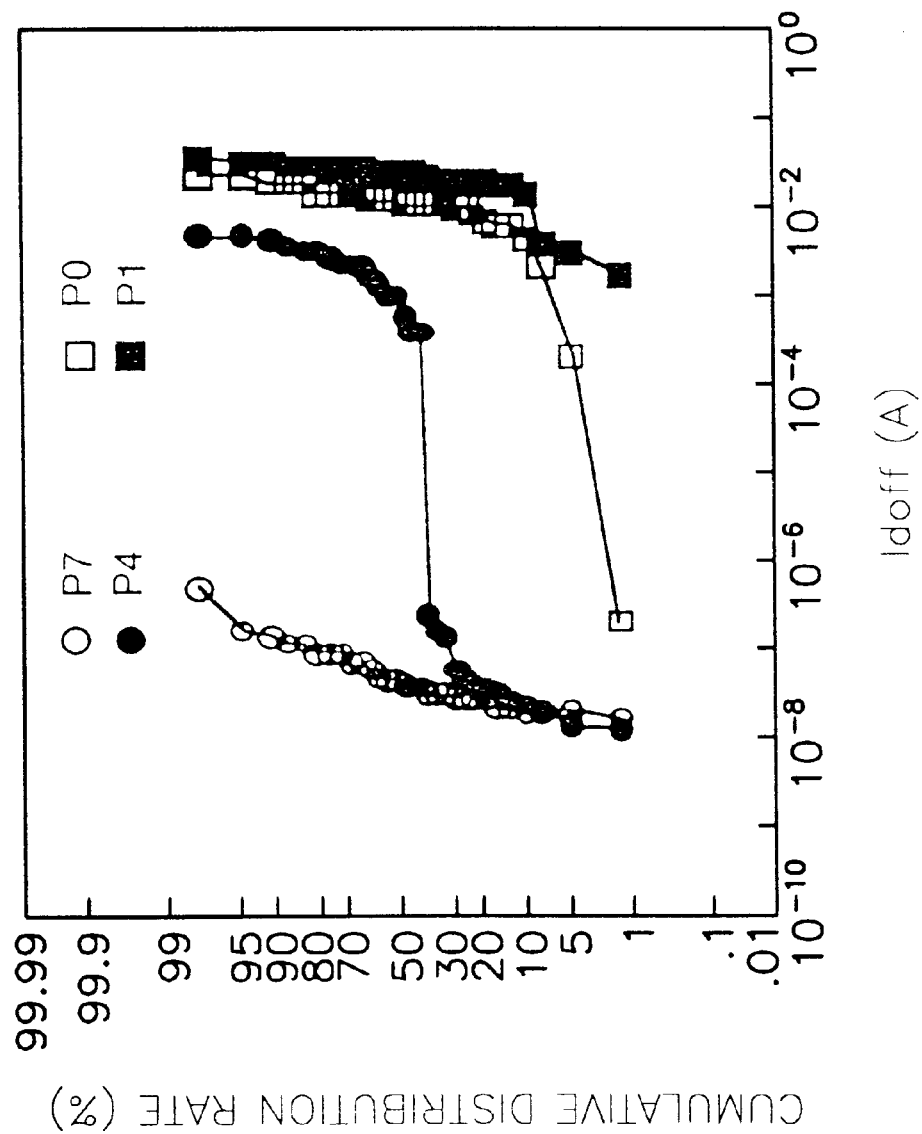
FIG. 7 is a graph showing a cumulative distribution of off-current characteristics of a transistor formed in a semiconductor substrate having trench isolation films formed thereon, in various conditions.

FIG. 7 is a graph showing cumulative distribution of off-current (leakage current) characteristics of transistors formed in the semiconductor substrate having a trench isolation film formed under the conditions of each sample in Table 1. From FIG. 7, it can be seen that the off-current decreases as the defect density in the semiconductor substrate decreases. That is, when the stress in the trench filling oxide film is large, many defects are generated in the semiconductor substrate, and thus off-current also increases.

According to the preferred embodiment of the present invention as described above, a trench filling oxide film is a composite film comprised of two oxide films having opposite stress characteristics. Thus, during the initial deposition and the subsequent thermal treatment of the trench filling oxide film, stress in the trench filling oxide film and stress applied by the trench filling oxide film to the semiconductor substrate can be reduced. Consequently, the generation of defects due to the stress in the semiconductor substrate can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A trench isolation method for an integrated circuit device, comprising the steps of:

forming a trench filling oxide film, comprised of first and second stacked oxide films having different stress characteristics, on an integrated circuit substrate having a plurality of trenches therein, the first stacked oxide film filling the trench and the second stacked oxide film being on the first stacked oxide film outside the trench;

densifying the trench filling oxide film; and planarizing the trench filling oxide film to form a trench filling layer in the trench regions.

2. A trench isolation method as claimed in claim 1, wherein the first and second stacked oxide films have opposite stress characteristics.

3. A trench isolation method as claimed in claim 2, wherein one of the first and second stacked oxide films has tensile stress characteristics, and wherein the other of the first and second stacked oxide films has compressive stress characteristics.

4. A trench isolation method as claimed in claim 3, wherein the first stacked oxide film is a tetra-ethyl-orthosilicate (TEOS)-$O_3$ based chemical vapor deposition (CVD) oxide film.

5. A trench isolation method as claimed in claim 4, wherein the second stacked oxide film is selected from the group consisting of a TEOS based plasma enhanced CVD (PECVD) oxide film, an $SiH_4$ based PECVD oxide film and a high density plasma (HDP) oxide film.

6. The trench isolation method as claimed in claim 3, wherein the first stacked oxide film is formed of an HDP oxide film.

7. The trench isolation method as claimed in claim 6, wherein the second stacked oxide film is formed of a TEOS-$O_3$ based CVD oxide film.

8. A trench isolation method as claimed in claim 1, wherein the step of forming a trench filling oxide film is preceded by the steps of:

forming a mask layer on the integrated circuit substrate to expose predetermined regions thereof;

etching the exposed regions the substrate using the mask layer as an etch mask, to form the trenches; and forming an oxide film on the sidewalls and the bottom surfaces of the trenches.

9. A trench isolation method as claimed in claim 8, wherein the step of forming a mask layer comprises the steps of:

forming a pad oxide film on the substrate;

forming a nitride film on the pad oxide film; and sequentially patterning the nitride film and the pad oxide film.

10. A trench isolation method as claimed in claim 9:

wherein the following step is performed between the steps of forming a nitride film and sequentially patterning: forming a sacrificial oxide film on the nitride film; and wherein the sequential patterning step comprises the step of sequentially patterning the sacrificial oxide film, the nitride film and the pad oxide film.

11. A trench isolation method as claimed in claim 10, wherein the sacrificial oxide film is formed by thermal oxidation.

12. A trench isolation method as claimed in claim 8, wherein the oxide film is formed on the sidewalls and the bottom surface of the trench region by thermal oxidation.

13. A trench isolation method as claimed in claim 1, wherein the step of densifying said trench filling oxide film comprises the step of thermally-treating the trench filling oxide film at between about 1000° C. and 1200° C.

14. A trench isolation method as claimed in claim 1, wherein the step of planarizing the trench filling oxide film is performed by chemical mechanical polishing (CMP) or by etching.

15. A trench isolation method as claimed in claim 8, wherein the planarizing step is followed by the step of removing the mask layer.

* * * * *